(12) United States Patent
Shiraki et al.

(10) Patent No.: US 6,279,585 B1
(45) Date of Patent: Aug. 28, 2001

(54) ETCHING METHOD AND METHOD FOR MANUFACTURING SEMICONDUCTOR DEVICE USING THE SAME

(75) Inventors: Satoshi Shiraki, Toyoashi; Makoto Ohkawa, Kariva, both of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/390,679

(22) Filed: Sep. 7, 1999

(30) Foreign Application Priority Data

Sep. 9, 1998 (JP) .................................................. 10-255631
Jul. 16, 1999 (JP) .................................................. 11-203561

(51) Int. Cl.[7] .............................................. H01L 21/302
(52) U.S. Cl. ......................... 134/1.3; 438/238; 438/382; 438/751; 438/754; 438/705; 216/87; 216/101
(58) Field of Search ................................ 134/1.3; 216/87, 216/100, 101; 438/754, 751, 705, 238, 382

(56) References Cited

U.S. PATENT DOCUMENTS

| | | | |
|---|---|---|---|
| 4,443,295 | * | 4/1984 | Radigan et al. ........................ 156/657 |
| 5,043,295 | | 8/1991 | Ruggerio et al. . | |
| 5,334,332 | * | 8/1994 | Lee ........................................ 252/548 |
| 5,382,916 | | 1/1995 | King et al. . | |
| 5,420,063 | | 5/1995 | Maghsoudnia et al. . | |
| 5,503,878 | | 4/1996 | Suzuki et al. . | |
| 5,525,831 | | 6/1996 | Ohkawa et al. . | |
| 5,989,970 | * | 11/1999 | Ohkawa et al. ........................ 438/384 |

FOREIGN PATENT DOCUMENTS

| | | |
|---|---|---|
| 2-058259 | 2/1990 | (JP) . |
| 7-202124 | 8/1995 | (JP) . |
| 7-335831 | 12/1995 | (JP) . |
| 8-250462 | 9/1996 | (JP) . |
| 10-022452 | 1/1998 | (JP) . |
| 10-144866 | 5/1998 | (JP) . |

* cited by examiner

*Primary Examiner*—Gregory Mills
*Assistant Examiner*—George Goudreau
(74) *Attorney, Agent, or Firm*—Pillsbury Winthrop LLP (57) ABSTRACT

In a method for manufacturing a semiconductor device, a barrier metal disposed on a metallic thin film for forming a thin film resistor is patterned by wet-etching. The wet-etching produces a residue of the barrier metal. The residue is removed after the oxidation thereof. Accordingly the residue is completely removed. As a result, the patterning of the thin film resistor is stably performed, and short-circuit does not occur to a wiring pattern disposed above the barrier metal.

18 Claims, 11 Drawing Sheets

ETCHING METHOD AND METHOD FOR MANUFACTURING SEMICONDUCTOR DEVICE USING THE SAME

CROSS REFERENCE TO RELATED APPLICATION

This application is based upon and claims the benefit of Japanese Patent Application No. 10-255631 filed on Sep. 9, 1998, and No. 11-203561 filed on Jul. 16, 1999, the contents of which are incorporated herein by reference.

BACKGROUND OF THE INVENTION

1. Field of the Invention

This invention relates to an etching method particularly for forming a wiring pattern, a barrier metal or the like made of tungsten or its alloy.

2. Description of the Related Art

For example, a thin film resistor made of CrSi or the like adopts a sandwich structure as an electrode structure in which a barrier metal is sandwiched between an Al thin film and a thin film resistor to prevent mutual diffusion therebetween. Accordingly, its characteristics is prevented from deteriorating due to the mutual diffusion.

When such a barrier metal is formed by dry-etching which cannot provide a sufficient selective ratio between the barrier metal and the thin film resistor, the thin film resistor exposed by over-etching is easily etched. Generally, since the thin film resistor has a thin thickness of approximately 10 nm, the etching of the thin film resistor greatly changes characteristics such as a value of resistance thereof. Therefore, the barrier metal needs to be formed by wet-etching which can provide a sufficient etching selective ratio.

Figure 17A:
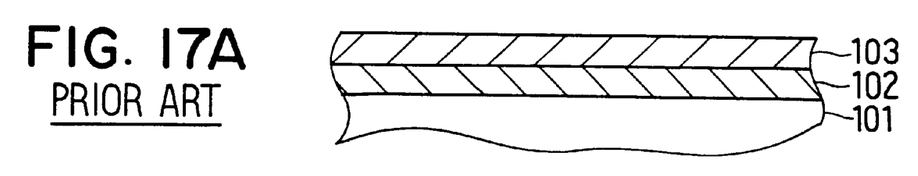
FIGS. 17A to 17C are cross-sectional views for explaining a state where barrier metal is patterned in a prior art.
Figure 17B:
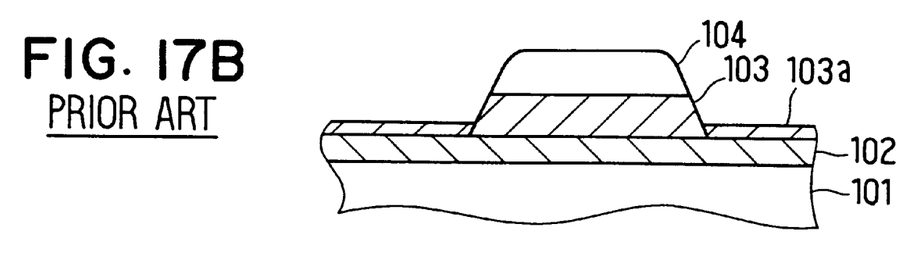
Figure 17C:
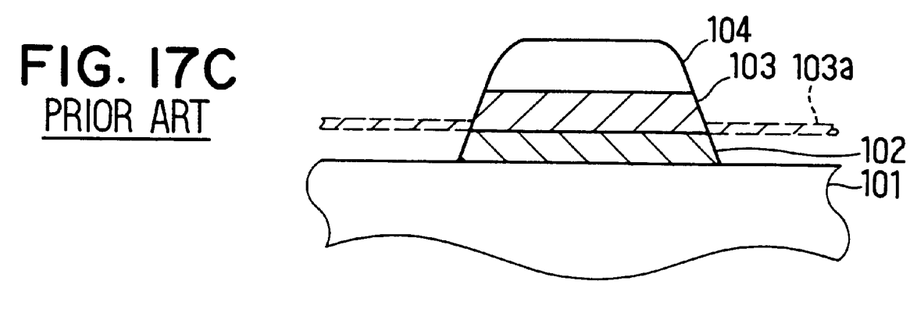

The wet-etching of the barrier metal, however, may produce residues which can interrupt the patterning of the thin film resistor and cause short-circuit to a wiring pattern. These problems are more specifically explained referring to FIGS. 17A to 17C, and 18A to 18E which show patterning processes of the sandwich structure composed of the Al thin film, the barrier metal, and the thin film resistor. The patterning process shown in FIGS. 17A to 17C are different from that shown in FIGS. 18A to 18E. FIGS. 17A to 17C shows a case where the thin film resistor is patterned after the barrier metal is patterned, while FIGS. 18A to 18E shows a case where the thin film resistor is patterned before the barrier metal is patterned.

When the process shown in FIGS. 17A to 17C is adopted, first, as shown in FIG. 17A, a CrSi film 102 for forming the thin film resistor and a TiW film 103 for forming the barrier metal are deposited on an insulation film 101 in sequence. After that, as shown in FIG. 17B, the TiW film 103 is patterned using a resist 104 as a mask to form the barrier metal. At that time, a residue 103a of TiW remains on the CrSi film 102. As shown in FIG. 17C, when the thin film resistor is patterned by, for example, chemical dry-etching to have a defined shape, the residue 103a adversely affects the patterning.

Figure 18A:
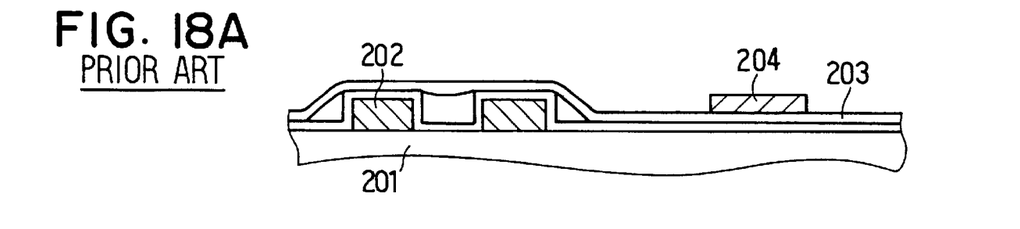
FIGS. 18A to 18E are cross-sectional views for explaining a state where barrier metal is patterned in a prior art.
Figure 18B:
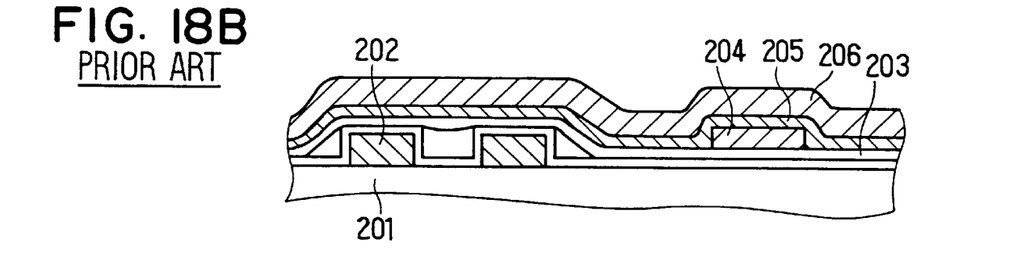
Figure 18C:
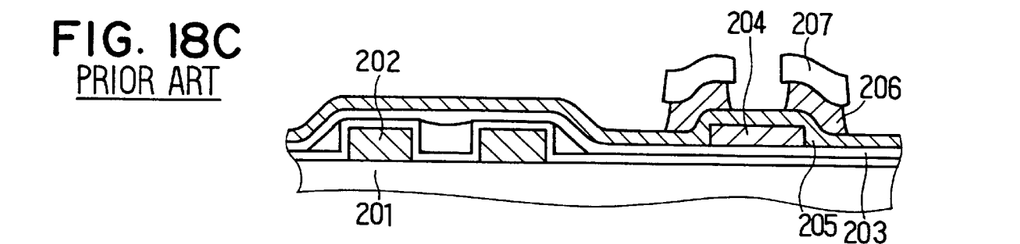
Figure 18D:
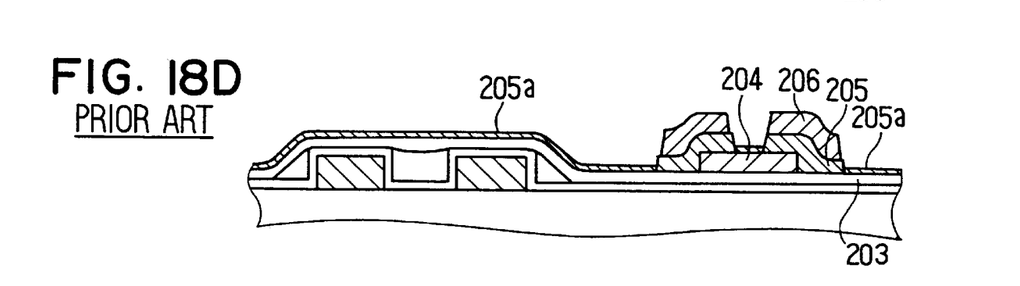
Figure 18E:
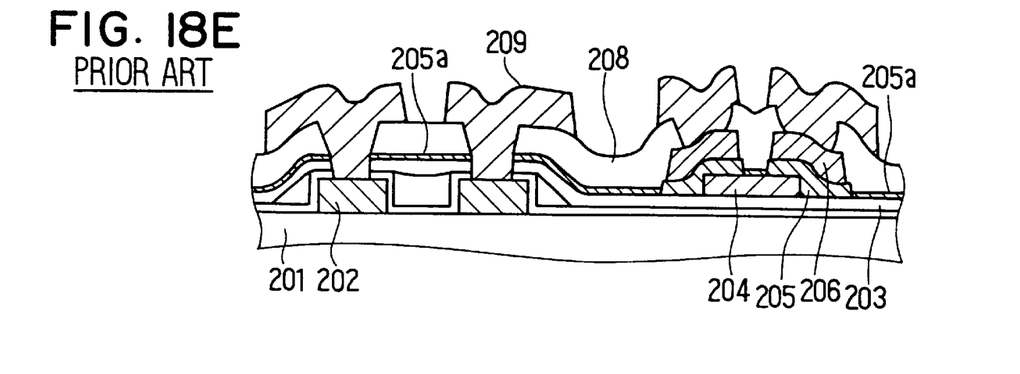

Meanwhile, when the process shown in FIGS. 18A to 18E is adopted, first, as shown in FIG. 18A, a 1st Al 202 is formed on an insulation film 201, and a thin film resistor 204 is formed adjacently to the 1st Al 202 through an insulation film 203. After that, as shown in FIG. 18B, a TiW film 205 for forming the barrier metal and an Al thin film 206 are deposited in sequence. As shown in FIG. 18C, the Al thin film layer 206 is patterned using a resist 207 as a mask. Further, as shown in FIG. 18D, the TiW film 205 is patterned to form the barrier metal. At that time, a residue 205a of TiW remains on the thin film resistor 204 and on the insulation film 203. Therefore, as shown in FIG. 18E, when a wiring pattern 209 is formed through an insulation film 208, the wiring pattern 209 may be short-circuited by the residue 205a.

It is not easy to remove the residues 103a, 105a by lengthening the etching time and/or by changing etching conditions such as a temperature of etching solution. For example, when the etching time is lengthened, the resist as the patterning mask is separated to deteriorate a patterning accuracy.

SUMMARY OF THE INVENTION

The present invention has been made in view of the above problems. An object of the present invention is to completely remove a specific portion of a thin film including tungsten without remaining a residue thereof. Another object of the present invention is to provide a method for manufacturing a semiconductor device, in which a thin film resistor is stably performed and a wiring pattern is not short-circuited by eliminating effects caused by a residue produced when an electrode material is patterned.

According to a first aspect of the present invention, a specific region of a thin film including tungsten is removed by an alkaline solution after the specific region is oxidized. As a result, the specific region can be completely removed.

According to a second aspect of the present invention, after an electrode material including tungsten is patterned to produce a residue, the residue is oxidized and then is removed.

According to a third aspect of the present invention, in a method for forming a semiconductor device, a residue, which is produced when a barrier metal film for forming a barrier metal is patterned, is removed after the oxidation thereof. Accordingly, the residue can be completely removed. A thin film resistor film underlying the barrier metal film may be patterned for forming a thin film resistor before the barrier metal film is patterned. Otherwise, the thin film resistor film may be patterned after the residue is removed. In this case, the patterning of the barrier metal film can be stably performed without being adversely affected by the residue.

Preferably, the barrier metal film is patterned by wet-etching to produce the residue. The barrier metal film can be patterned through a resist provided on the barrier metal film and serving as a mask. In this case, the resist and the residue can be removed at the same time, resulting in a simplified manufacturing process. The resist may be removed separately from the residue.

An insulation film can be formed to cover the barrier metal and the thin film resistor after the residue is removed, and a wiring pattern can be formed on the insulation film to communicate with the barrier metal through a contact hole in the insulation film. In this case, because the residue does not remain, the wiring pattern is not short-circuited by the residue.

BRIEF DESCRIPTION OF THE DRAWINGS

Other objects and features of the present invention will become more readily apparent from a better understanding of the preferred embodiments described below with reference to the following drawings.

DETAILED DESCRIPTION OF THE PREFERRED EMBODIMENT

Figure 1:
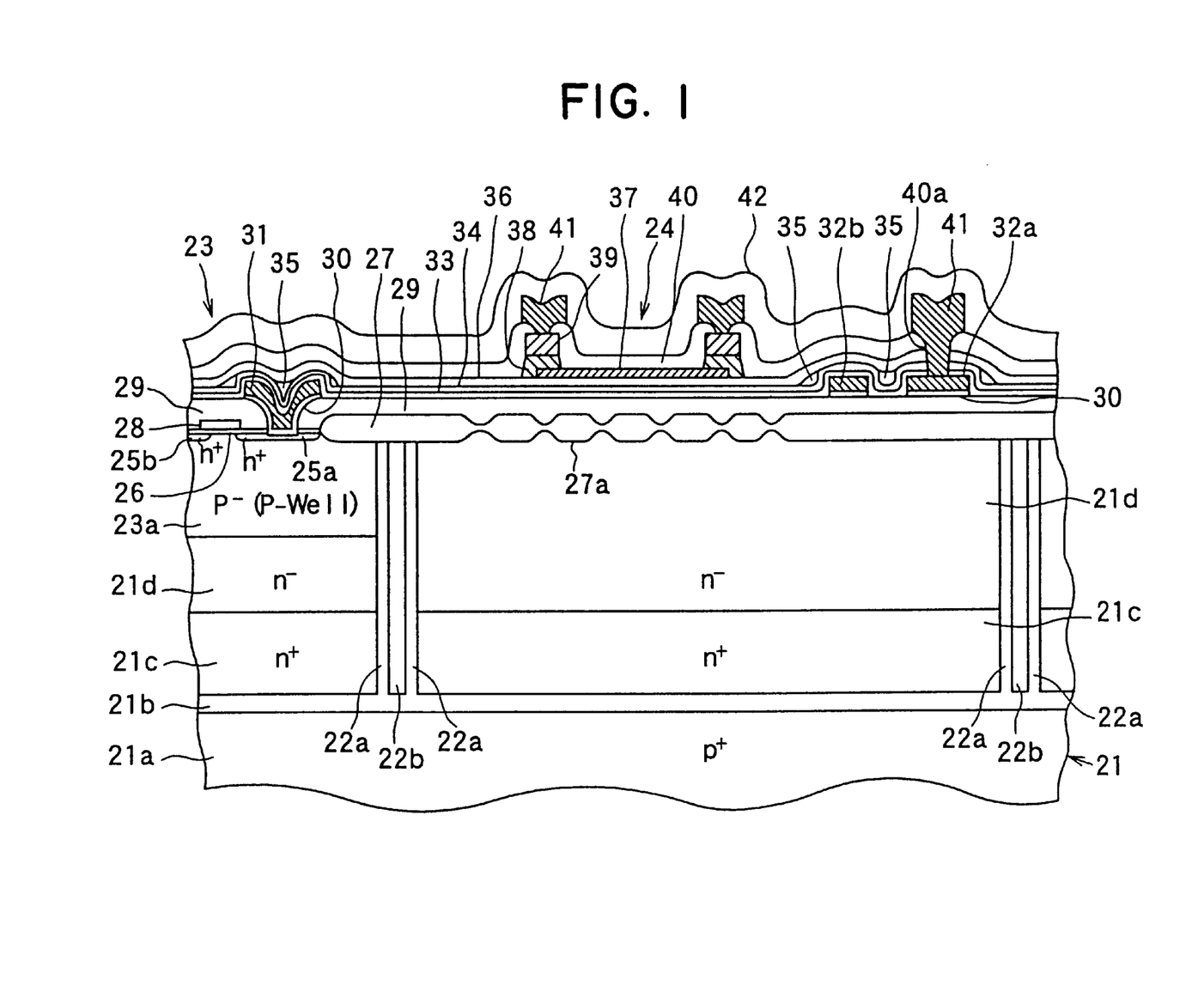
FIG. 1 is a cross-sectional view showing an integrated circuit including a MOSFET part and a CrSi resistor part formed by a method in a preferred embodiment of the present invention.

Referring to FIG. 1, an integrated circuit of a MOSFET formed by a method in a preferred embodiment has a SOI (Silicon On Insulator) structure, in which a high impurity concentration n type layer 21c and a low impurity concentration n type layer 21d are provided on a high impurity concentration p type substrate 21a through a silicon oxide film 21b. A trench is formed in the silicon substrate 21, and is filled with a silicon oxide film 22a and a polysilicon layer 22b. Accordingly, an element (MOSFET) formation region 23 and a thin film resistor formation region 24 are isolated from each other.

In the element formation region 23, a p type well layer 23a is formed by implanting p type impurities into the n type layer 21d, and an n type source region 25a and an n type drain region 25b are provided in a surface region of the p type well layer 23a.

A gate oxide film 26 is formed on the surface of the p type well layer 23a between the source region 25a and the drain region 25b. A LOCOS film 27 is formed on the surface of the silicon substrate 21 to isolate the thin film resistor formation region 24 from the element formation region 23. A gate electrode 28 is formed on the gate oxide film 26, and the gate electrode 28 is covered with a BPSG insulation film 29. The source region 25a and the drain region 25b are electrically connected to a TiN film 30 and an AlSiCu film 31 as a 1st Al film (source electrode and drain electrode) via contact holes. Wiring patterns 32a, 32b provided on the BPSG film 29 within the thin film resistor formation region 24 are formed simultaneously when the AlSiCu film 31 is formed.

The gate electrode 28 and the source (drain) electrode 31 are covered with a P-SiN film 33, a TEOS film 34, a SOG (Spin on Glass) 35, and a TEOS film 36. Then, a thin film resistor 37 is disposed at a specific position on the silicon oxide film 36. The thin film resistor 37 is composed of a CrSi film with a thickness of approximately 15 nm. The LOCOS film 27 has an irregularly shaped part 27a which underlies the thin film resistor 37 for scattering laser beam when laser trimming is performed to adjust a value of resistance of the thin film resistor 37. The irregularly shaped part 27a prevents interference of the leaser beam and the like so that the thin thin film resistor 37 can be desirably fused and cut.

A barrier metal 38 is disposed on both ends of the thin film resistor 37, and an Al thin film 39 as thin film resistor electrodes is disposed on the barrier metal 38. Further, a silicon oxide film 40 is formed as an intermediate insulation film to cover the entire surface of the silicon substrate 21 including the thin film resistor 37. An Al thin film 41 is formed as a 2nd Al film to form a wiring pattern filling via holes 40a formed in the silicon oxide film 40. The upper surface of the silicon substrate 21 including the Al thin film 41 is entirely covered with a protective film 42 composed of a P-SiN film.

Next, the method of manufacturing the integrated circuit of the MOSFET will be explained referring to FIGS. 2–12. First, at a step shown in FIG. 2, the silicon substrate 21 in which the high impurity concentration n type layer 21c and the low impurity concentration n type layer 21d are disposed on the high impurity concentration p type substrate 21a through the silicon oxide film 21b is prepared. Then, the trench is formed to reach the silicon oxide film 21b at the interface between the elements. The silicon oxide film 22a is disposed on the side wall of the trench, and the gap defined by the silicon oxide film 22a is filled with the polysilicon layer 22b, thereby performing the element isolation.

Figure 2:
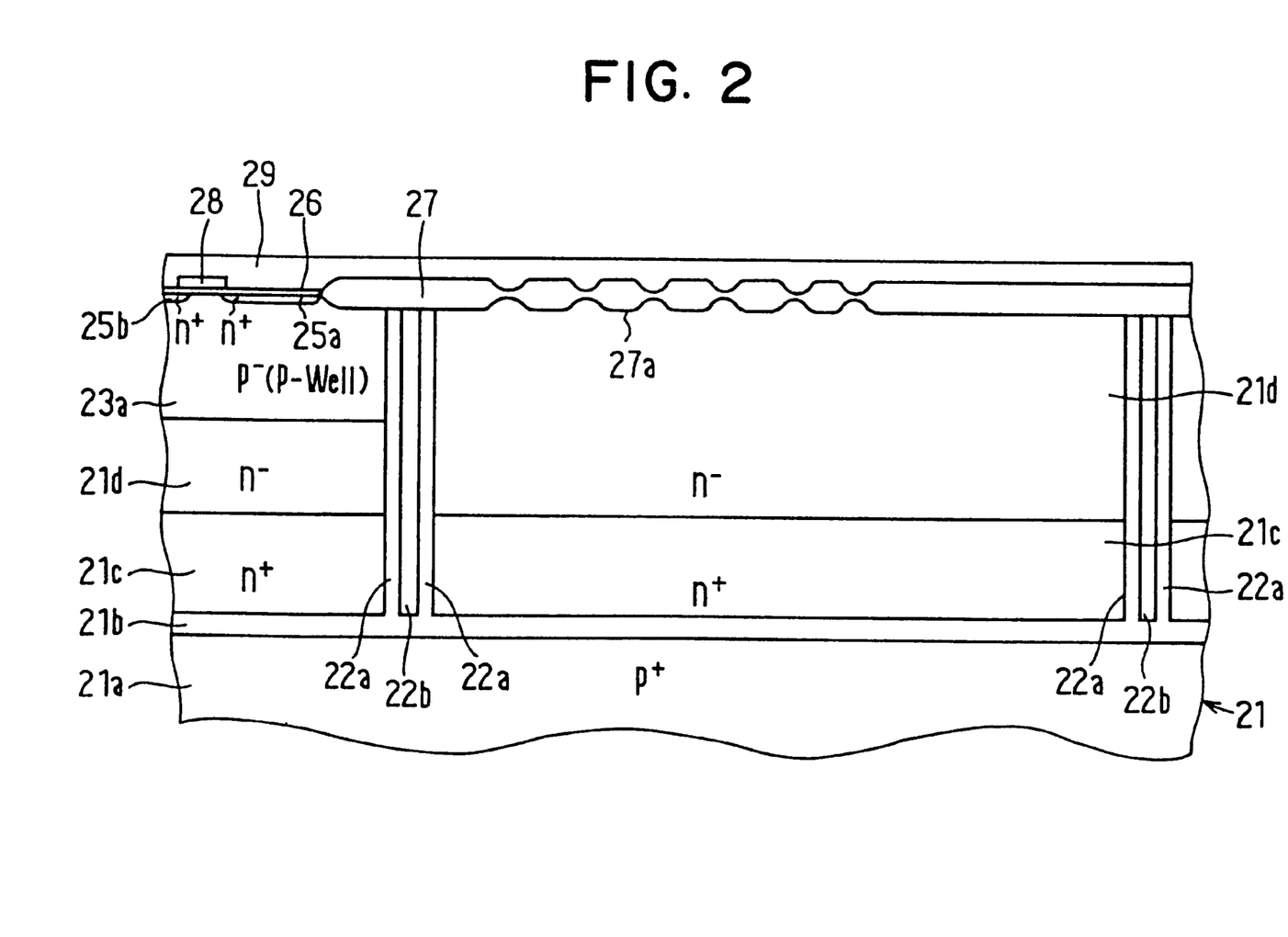
FIGS. 2 to 12 are cross-sectional views showing a process for manufacturing the integrated circuit in a step-wise manner in a first preferred embodiment.

Next, selective ion implantation is carried out so that the p type well layer 23a is formed in the surface region of the n type layer 21d in the MOSFET formation region 23. Then, the LOCOS oxide film 27 is formed on the trench by LOCOS oxidation to have the irregularly shaped part 27a in the thin film resistor formation region 24 for improving the workability of the laser trimming for the thin film resistor 37 (see FIG. 1).

After the gate oxide film 26 is formed on the p type well layer 23a, polysilicon is deposited thereon. The gate electrode 28 is formed by patterning the polysilicon. Then, ion implantation is carried out using the gate electrode 28 as a mask, and then a heat treatment is performed. Consequently, the source region 25a and the drain region 25b are formed. After that, the BPSG film 29 is formed on the entire surface of the silicon substrate 21 as an intermediate insulation film by a CVD method or the like. Then, a reflow treatment is carried out.

Figure 3:
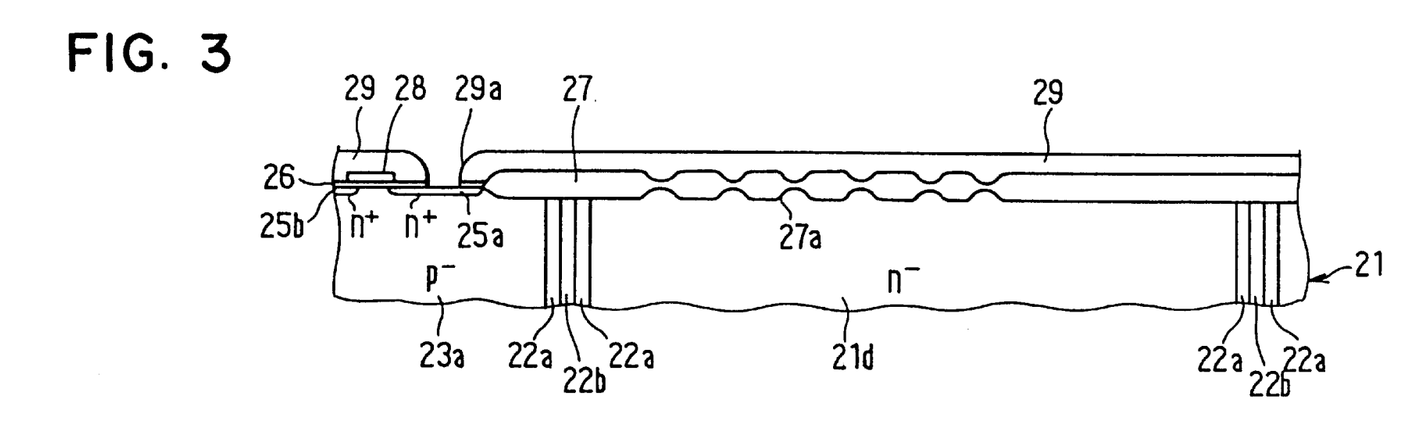
Figure 4:
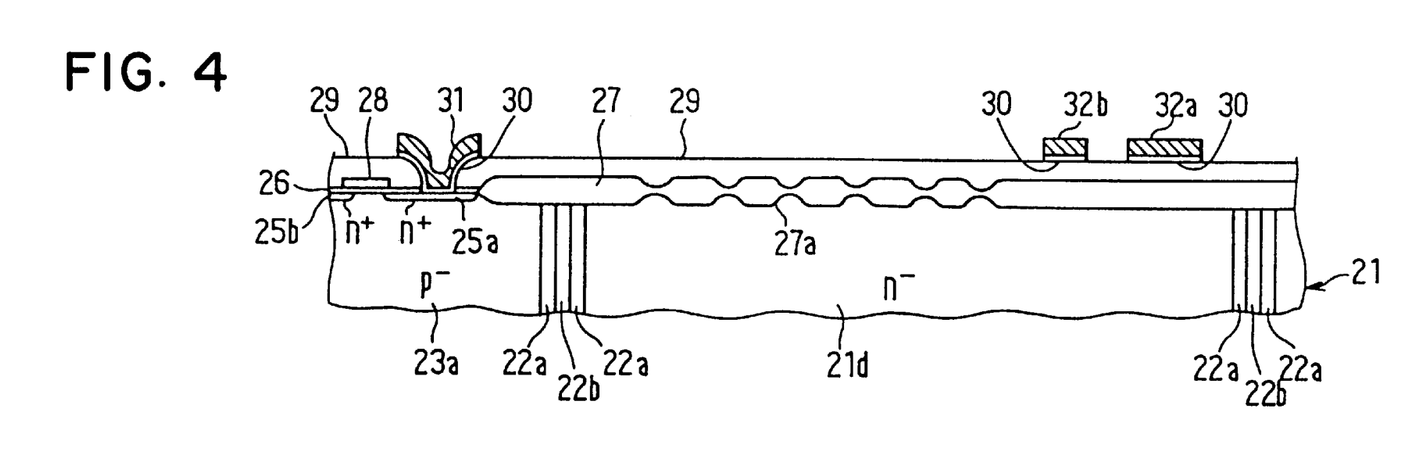

At a step shown in FIG. 3, after a contact hole 29a is formed in the BPSG film 29, a reflow treatment is carried out at a temperature in a range of approximately 900° C. to 950° C. to make an edge portion of the contact hole 29a smooth. At a step shown in FIG. 4, the TiN film 30 as barrier metal is formed with a thickness of approximately 100 nm. Then, after the AlSiCu film is deposited with a thickness of approximately 0.45 $\mu$m by sputtering, the 1st Al film 31 is patterned by ECR (Electron cyclotron resonance) dry-etching.

Figure 5:
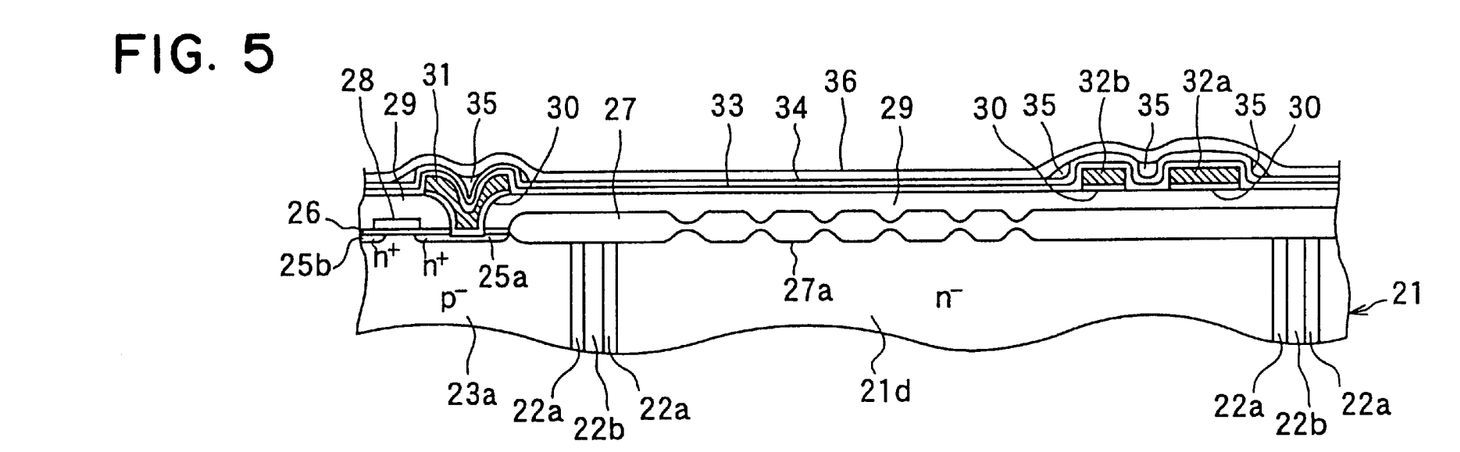

At a step shown in FIG. 5, after the P-SiN film 33 is deposited with a thickness of approximately 0.1 $\mu$m, the TEOS film 34 is formed with a thickness of approximately 0.2 $\mu$m. Further, after coating SOG, irregular portions on the surface of the silicon substrate 21 are filled with the SOG 35 by baking and etch-back treatments so that the surface of the silicon substrate 21 is flattened. Further, the TEOS film 36 is deposited with a thickness of approximately 0.3 $\mu$m by the CVD method.

Figure 6:
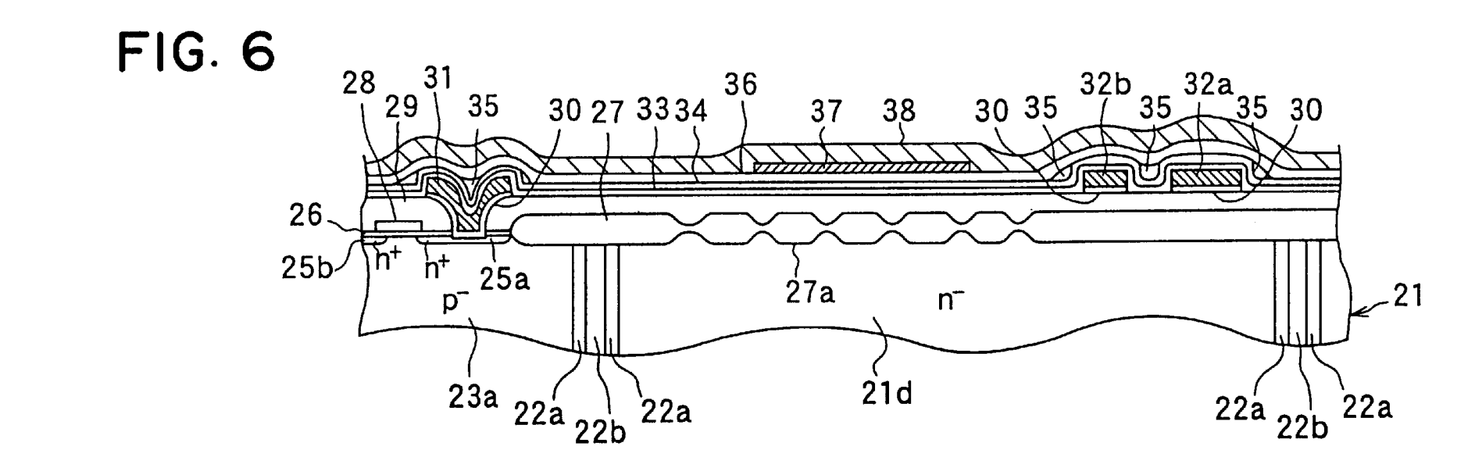
Figure 7:
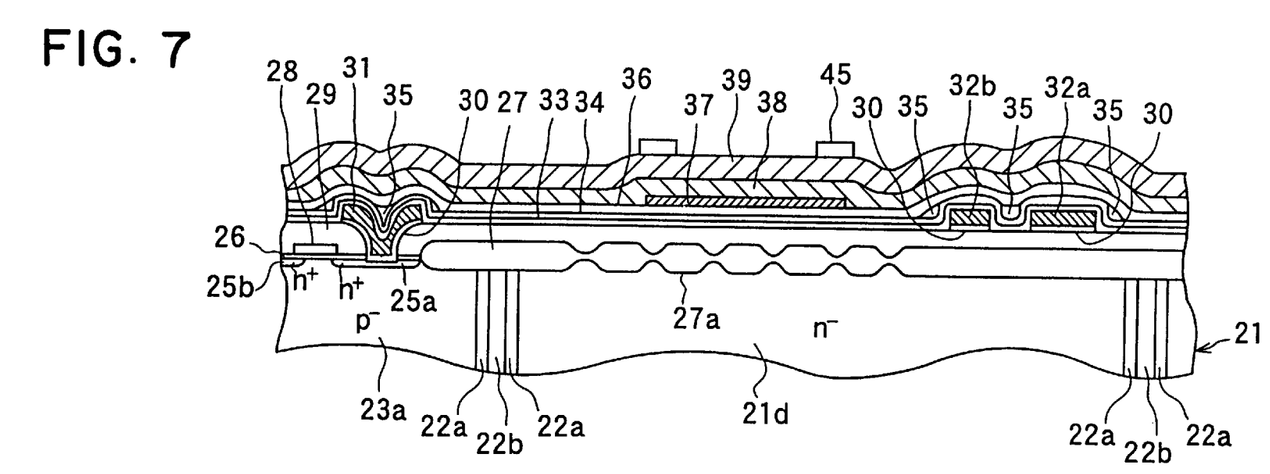

Then, at a step shown in FIG. 6, the CrSi film is deposited by sputtering with a thickness of approximately 15 nm, and is patterned to form the thin film resistor 37. Further, the barrier metal 38 composed of a TiW film is deposited on the enter surface of the silicon substrate 21 including the thin film resistor 37, with a thickness of approximately 1000 Å. After that, at a step shown in FIG. 7, the Al thin film 39 for forming the electrodes of the thin film resistor 37 is deposited with a thickness of approximately 2000 Å. Then, a photo-resist 45 is formed and is patterned to be left on both ends of the thin film resistor 37 for performing a photo-lithography step.

Figure 8:
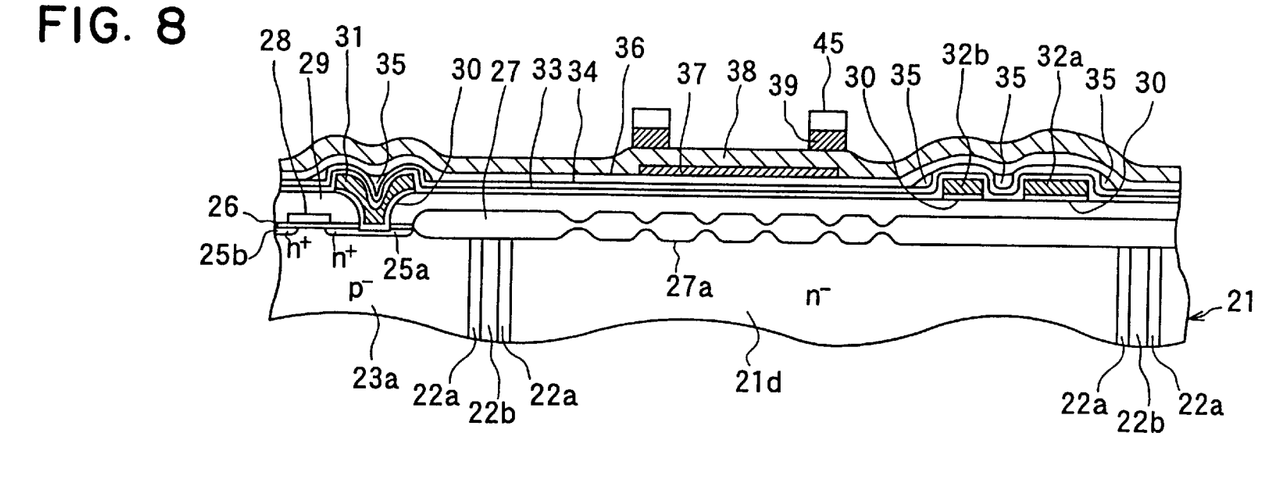

At a step shown in FIG. 8, the Al thin film 39 is patterned by wet-etching using the photo-resist 45 as a mask. Successively, at a step shown in FIG. 9, the barrier metal 38 is patterned by wet-etching using the photo-resist 45 as a mask again. In this wet-etching, $H_2O_2/NH_{40}OH$ based solution is used as etching solution. Therefore, a high etching rate can be realized to prevent the photo-resist 45 from floating, as compared to case where the etching solution includes only $H_2O_2$.

Figure 9:
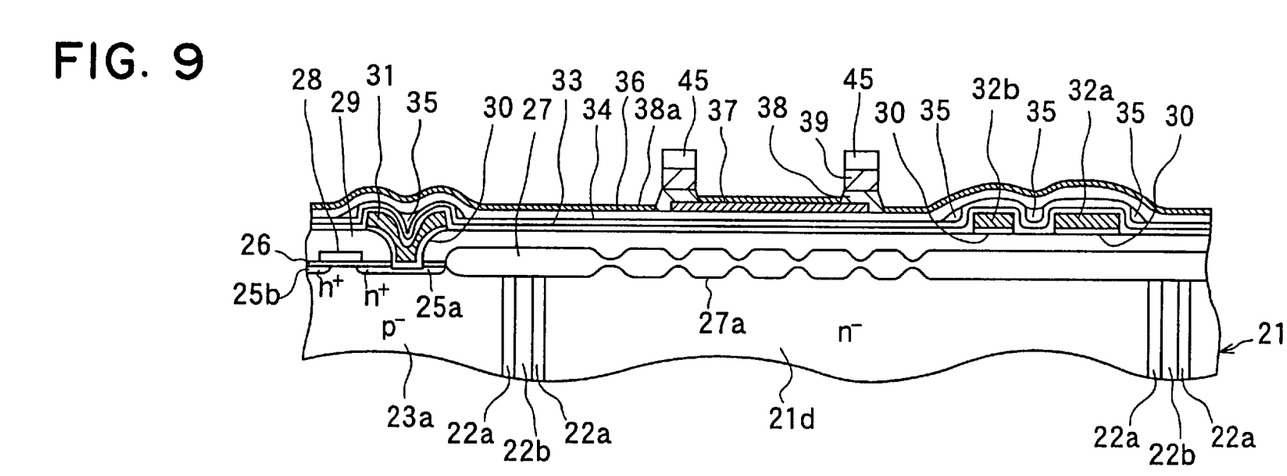

At that time, TiW forming the barrier metal 38 is dissolved as complex ions through the following reactions (1) and (2).

$$Ti+6NH_4^++4e^-\to[Ti(NH_3)_6]^{2+}+3H_2 \quad (1)$$

$$W+8OH^-\to[WO_4]^{2-}+4H_2O+6e^- \quad (2)$$

It is considered that the reaction (1) of Ti is more active that the reaction (2) of W. Accordingly, it is assumed that a W film (approximately 10 Å in thickness) not including Ti remains as a residue 38a on the thin film resistor 37 and on the TEOS film 36 as a result of the etching. Then, the residue 38a is sufficiently oxidized by an oxygen-plasma treatment, thereby forming oxide. The photo-resist 45 is not burned during the oxidation of the residue 38a by the oxygen-plasma treatment.

Figure 10:
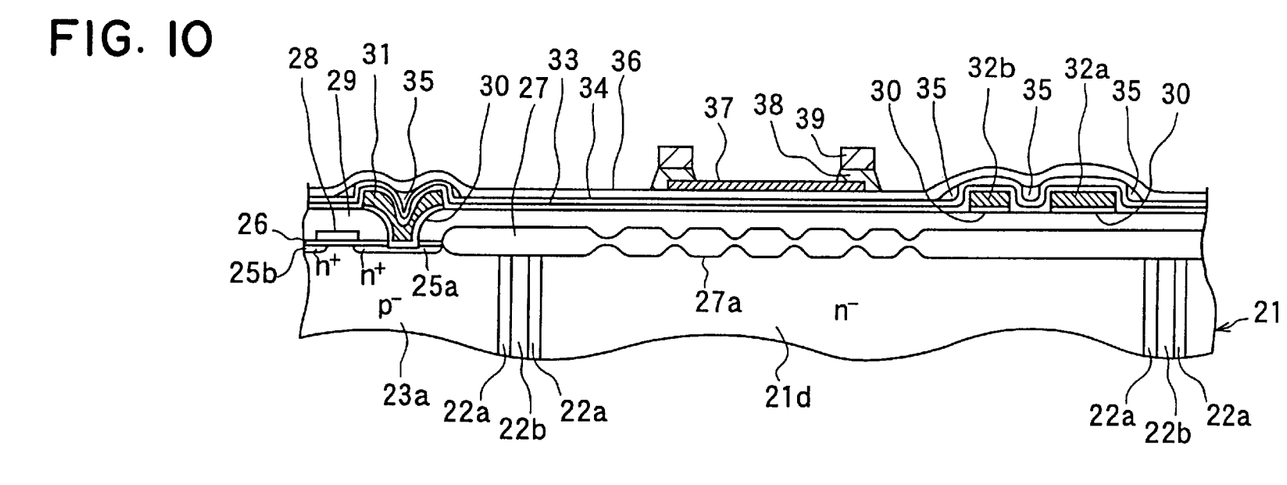

Then, at a step shown in FIG. 10, the oxidized residue 38a is removed together with the photo-resist 45 by resist removing solution including organic amine or the like. Specifically, the oxidized residue 38a is dissolved into the resist removing solution to be completely removed together with the photo-resist 45. That is, the oxidized tungsten residue 38a has affinity to an OH group, and is easily dissolved into alkaline solution through the following reaction (3);

$$WO_3+2OH^-\to[WO_4]^{2-}+H_2O \quad (3)$$

Figure 11:
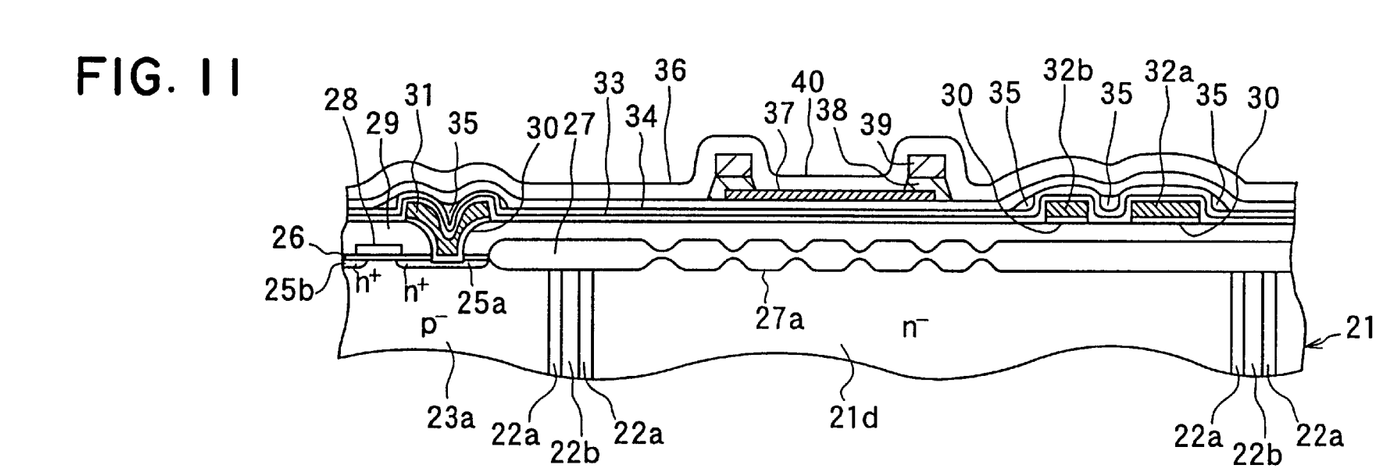

Next, at a step shown in FIG. 11, the surface of the silicon substrate 21 is entirely covered with the silicon oxide (SiO₂) film 40. At a step shown in FIG. 12, after the via holes 40a are formed in the silicon oxide film 40, the AlSi film 41 is formed as the 2nd Al film filling the via holes 40a, and is patterned into a wiring pattern. At that time, because the residue 38a formed when the barrier metal 38 is etched is completely removed, the AlSi film 41 is not short-circuited by the residue 38a.

Further, the upper surface of the silicon substrate 21 including the AlSi film 41 is entirely covered with the protective film 42 composed of a P-SiN film, and an anneal treatment is carried out. Accordingly, the integrated circuit of the MOSFET shown in FIG. 1 is completed. Thus, in the present embodiment, the residue 38a that is produced by the etching of the barrier metal (TiW) 38 including tungsten is oxidized to produce tungsten oxide, and is removed by the alkaline solution. Therefore, the residue 38a, removal of which only by wet-etching is difficult, is completely removed in the present embodiment, thereby preventing short-circuit of the wiring patterns.

(Second Embodiment)

A second preferred embodiment differs from the first embodiment in a method of patterning the barrier metal 38. A process of manufacturing the integrated circuit of the MOSFET in the second embodiment will be explained referring to FIGS. 13 to 16 which show only steps different from those in the first embodiment. Steps similar to first embodiment will be explained referring to the figures in the first embodiment.

First, the steps shown in FIGS. 2 to 5 are carried out substantially in the same manner as in the first embodiment, and then steps shown in FIGS. 13 to 16 are carried out. Specifically, at a step shown in FIG. 13, after the CrSi film 37 is deposited by sputtering with a thickness of approximately 15 nm, the barrier metal 38 is formed from TiW on the thin film resistor 37 to have a thickness of approximately 1000 Å. Then, a photo-resist 51 is deposited and is pattered to be left at desirable regions. After that, the barrier metal 38 is patterned. Accordingly, the residue 38a of TiW remains on the thin film resistor 37. Next, the residue 38a is oxidized by an oxidation plasma treatment.

Figure 14:
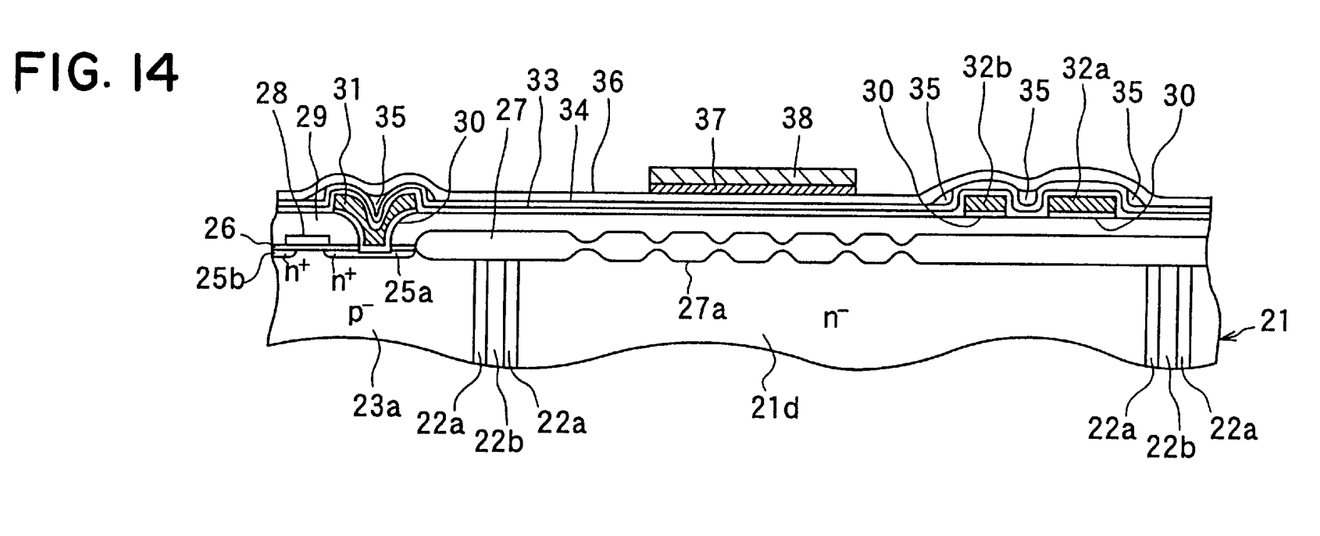

At a step shown in FIG. 14, the oxidized residue 38a is removed together with the photo-resist 51 using resist removing solution including organic amine or the like. The oxidized residue 38a is dissolved into the resist removing solution, and is completely removed together with the photo-resist 51. After that, the thin film resistor 37 is patterned by chemical dry-etching using CF₄ and oxygen. At that time, because the residue 38a produced by the patterning of the barrier metal 38 is completely removed, the patterning of the thin film resistor 37 is stably carried out.

Figure 15:
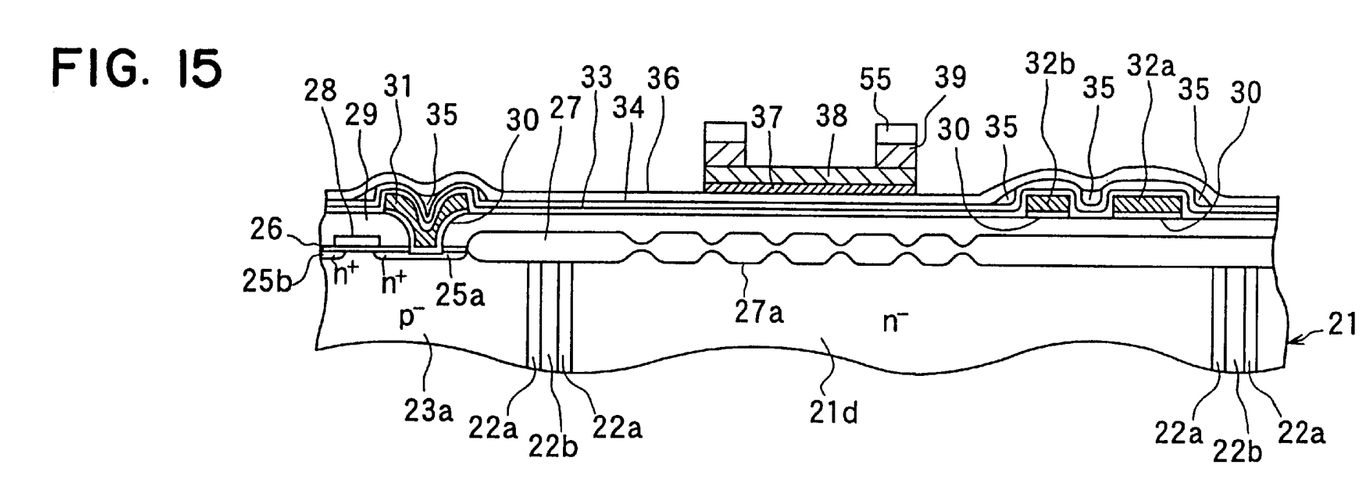
Figure 16:
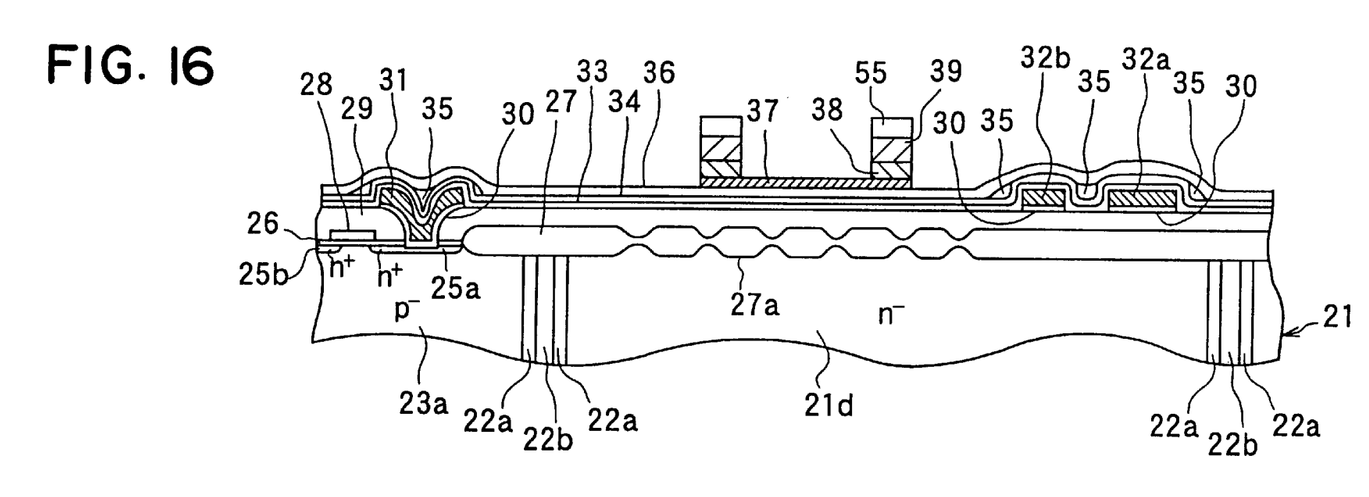

Subsequently, at a step shown in FIG. 15, the Al thin film 39 as the thin film resistor electrodes is deposited with a thickness of approximately 2000 Å. Then, a photo-resist 55 is formed and is patterned to exist at both ends of the thin film resistor 37. Then, dry-etching is carried out to pattern the Al thin film 39 using the photo-resist 55 as a mask. Next, at a step shown in FIG. 16, wet-etching is carried out to pattern the barrier metal 38 using the photo-resist 55 as a mask again and H₂O₂/NH₄OH based etching solution. This etching also produces residue of TiW on the thin film resistor 37. Therefore, the residue is removed by the oxidation plasma treatment and the treatment using the alkaline solution substantially in the same manner as described above.

Figure 12:
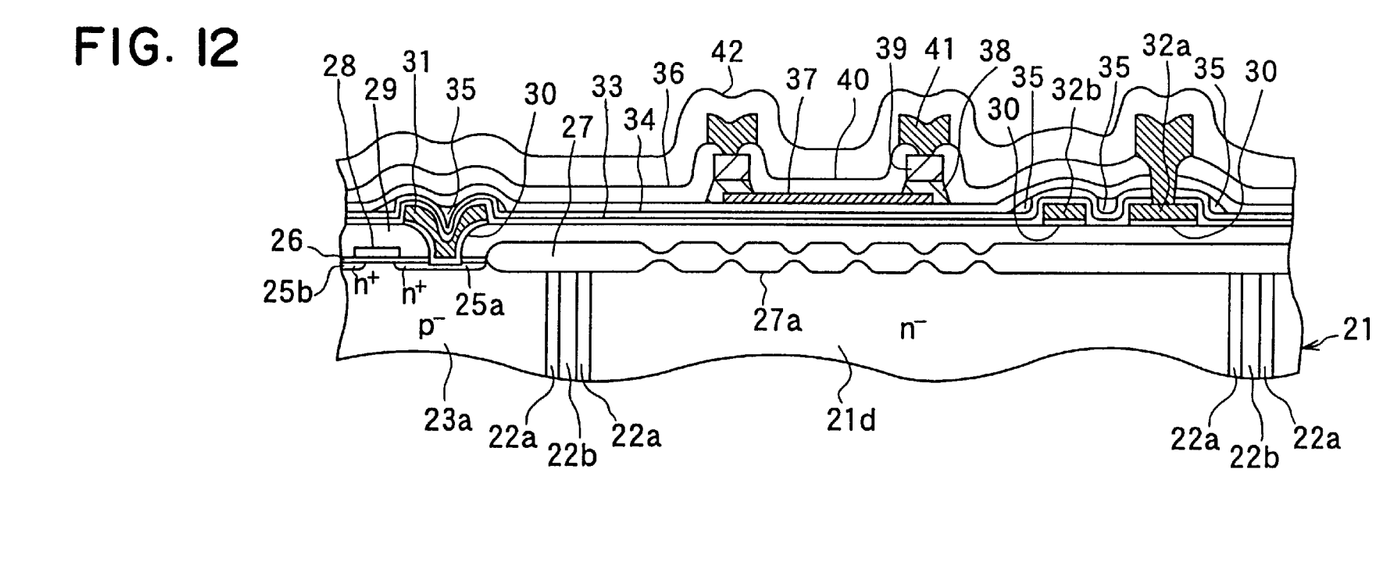
Figure 13:
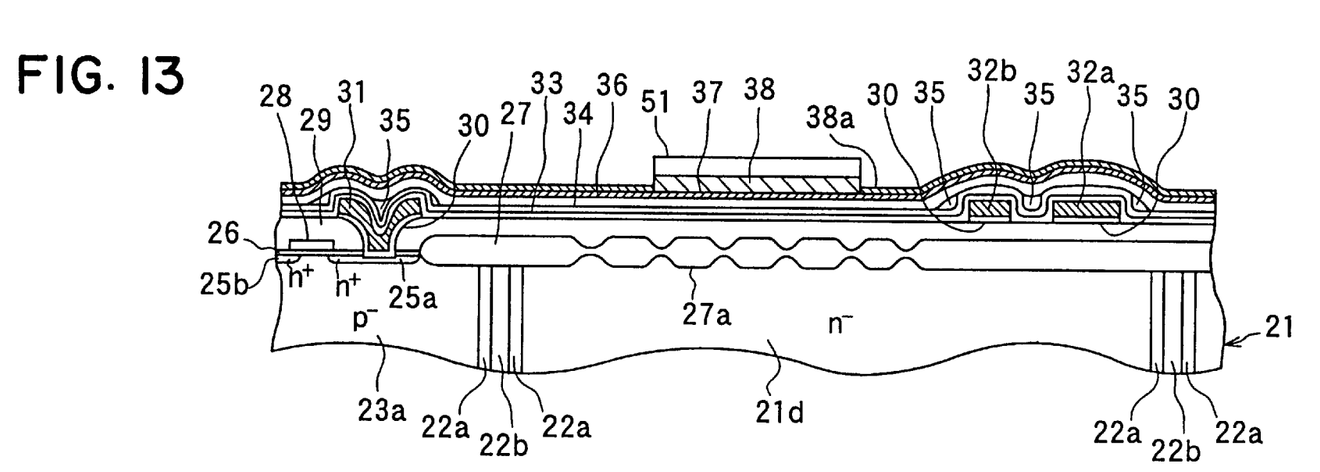
FIGS. 13 to 16 are cross-sectional views showing a process for manufacturing the integrated circuit in a step-wise manner in a second preferred embodiment.

After that, the step shown in FIGS. 11 and 12 are performed, thereby completing the integrated circuit of the MOSFET. Thus, according to the second embodiment, the patterning of the thin film resistor 37 can be stably performed by completely removing the residue 38a that is produced during the patterning of the barrier metal 38.

In the first and second embodiments described above, the residue 38a is removed together with the photo-resist 45, 51, or 55. This is because the oxidized residue 38a is dissolved in the organic amine solution used for removing the photo-resists 45, 51, and 55. Accordingly, the manufacturing process is simplified. However, the residue 38a needs not be always removed together with the photo-resists 45, 51, and 55, and may be removed by other alkaline solution. For example, H₂O₂/NH₄OH based solution may be used again to remove the oxidized residue 38a. The method of oxidizing the residue 38a is not limited to the O₂ plasma treatment, and may employ other oxidation treatments such as baking, ozone plasma treatment, and the like.

The present invention is applied to the patterning of titanium-tungsten forming the barrier metal 38 as the electrode portions of the thin film resistor 37; however, it may be applied to materials other than the titanium-tungsten alloy. For example, the present invention is applicable to materials including tungsten, such as tungsten film, tungsten silicide film, molybdenum-tungsten film, and tantalum-tungsten film.

Tungsten and its alloy are widely used for wiring patterns and the like of various semiconductor devices. It is apparent that the present invention is applied when these portions are etched. For example, tungsten or tungsten silicide is used independently, or cooperatively with polysilicon to form a laminated structure (poly-cide structure or poly-metal structure) as a gate electrode of a MOSFET element or a TFT element. Recently, tungsten has been widely used as buried metal buried in minute contact holes and via holes of submicron levels. Tungsten can be deposited on an entire surface of a substrate to be used as a wiring pattern after filling the contact holes and the via holes. Titanium-tungsten used in the embodiments described above may be used as barrier metal for electrode portions of semiconductor devices in addition to the thin film resistor, and be used as a wiring pattern with a laminated structure laminated with aluminum, gold, or the like.

In the first and second embodiments described above, wet-etching is performed to titanium tungsten as the barrier metal 38 in consideration of effects to the underlying thin film resistor 37. However, in a structure in which such limitation does not exist, dry-etching is generally performed to tungsten or tungsten alloy. For example, tungsten is etched by gas such as $SF_6/N_2$ or $CF_4/O_2$, tungsten silicide is etched by gas such as $SF_6/Cl_2$ or $SF_6/HBr$, and titanium tungsten is etched by gas such as $CF_4/O_2$ or $SF_6/Ar$.

For example, when titanium tungsten is dry-etched, however, titanium is liable to be attached to an etching chamber and an inside wall of an exhaust pipe of a dry-etching apparatus to thereby produce undesirable particles. Therefore, it is desirable to perform wet-etching superior to the dry-etching in processing ability. In such as case, the patterning is carried out using etching solution such as aqueous hydrogen peroxide or solution including hydrogen peroxide, ammonia, and water to provide an etching selectivity with respect to underlying silicon, silicon oxide film, silicon nitride film, glass, or the like. In this case, likewise, powdery or film-like etching residue is produced. The residue can cause leakage between electrodes and wiring patterns, and deterioration in processing accuracies of a gate having a poly-cide/poly-metal structure and polysilicon underlying the wiring pattern.

Therefore, the residue removing technique according to present invention can be applied to these device structures. That is, the problems caused by the residue can be effectively prevented by oxidizing the tungsten residue to transform it into tungsten oxide, and by dissolving the oxide into alkaline solution for removal.

Also, the present invention can be applied not only to the residue removing technique, but also to a patterning technique for patterning a wiring pattern including tungsten. For example, after a tungsten thin film is deposited as an electrode material, an unnecessary portion of the tungsten thin film for forming the wiring pattern is selectively oxidized, and is removed by alkaline solution.

While the present invention has been shown and described with reference to the foregoing preferred embodiments, it will be apparent to those skilled in the art that changes in form and detail may be made therein without departing from the scope of the invention as defined in the appended claims.

What is claimed is:

1. An etching method comprising:
    oxidizing a specific region of a thin film including tungsten;
    removing the specific region by an alkaline solution,
    patterning an electrode material including tungsten by a solution including hydrogen peroxide;
    oxidizing a residue that is produced when the electrode material is patterned; and
    removing the oxidized residue.

2. The etching method of claim 1, removing the oxidized residue by an alkaline solution.

3. A method for manufacturing a semiconductor device, comprising:
    forming a thin film resistor film on a substrate;
    forming a barrier metal film on the thin film resistor;
    forming an electrode film on the barrier metal film;
    patterning the electrode film to form an electrode;
    patterning the barrier metal film to form a barrier metal based on a shape of the electrode;
    oxidizing a residue that is produced when the barrier metal film is patterned; and
    removing the oxidized residue.

4. The method of claim 3, further comprising forming a resist with a specific pattern on the electrode film, wherein:
    the barrier metal film is patterned using the resist as a mask; and
    the resist is removed together with the oxidized residue.

5. The method of claim 3, wherein the oxidized residue is removed by a solution including organic amine.

6. A method for manufacturing a semiconductor device, comprising:
    forming a thin film resistor film for forming a thin film resistor on a semiconductor substrate;
    forming a barrier metal film for forming a barrier metal on the thin film resistor film;
    pattering the barrier metal film by wet-etching to define a shape of a specific portion of the barrier metal film and to produce a residue at a portion other than the specific portion of the barrier metal film;
    oxidizing the residue; and
    removing the oxidized residue.

7. The method of claim 6, further comprising patterning the thin film resistor film to define a shape of the thin film resistor, after the oxidized residue is removed.

8. The method of claim 7, further comprising:
    patterning the specific portion of the barrier metal film to form the barrier metal, before the thin film resistor film is patterned.

9. The method of claim 7, further comprising:
    oxidizing a secondary residue that is produced on the thin film resistor when the specific portion of the barrier metal film is patterned; and
    removing the oxidized secondary residue.

10. The method of claim 7, further comprising forming a resist with a specific pattern on the barrier metal film, wherein:
    the barrier metal film is patterned using the resist as a mask; and
    the resist is removed together with the oxidized residue.

11. The method of claim 10, further comprising forming a conductive film on the specific portion of the barrier metal film, after the thin film resistor film is patterned;
    patterning the conductive film;
    forming an insulation film on the thin film resistor and on the conductive film;
    forming a contact hole in the insulation film to expose the conductive film from the contact hole; and
    forming a wiring pattern communicating with the conductive film through the contact hole.

12. The method of claim 6, further comprising:
    patterning the thin film resistor film to define a shape of the thin film resistor, before the barrier metal film is formed; and
    the barrier metal film is patterned so that the specific portion of the barrier metal film remains on the thin film resistor as the barrier metal.

13. The method of claim 12, further comprising:

forming a conductive film on the barrier metal film;

forming a resist on the conductive film; and patterning the conductive film through the resist existing thereon, wherein the barrier metal film is patterned through the resist existing thereon after the conductive film is patterned.

14. The method of claim 13, wherein the resist is removed separately from the oxidized residue.

15. The method of claim 14, further comprising:

forming an insulation film on the substrate holding the thin film resistor and the barrier metal thereon, after the resist is removed;

forming a contact hole in the insulation film; and forming a wiring pattern communicating with the barrier metal through the contact hole.

16. The method of claim 6, further comprising forming a resist with a specific pattern on the barrier metal film, wherein:

the barrier metal film is patterned using the resist as a mask; and, the resist is removed together with the oxidized residue.

17. The method of claim 6, wherein the oxidized residue is removed by a solution including organic amine.

18. The method of claim 6, further comprising forming a resist with a specific pattern on the barrier metal film, wherein:

the barrier metal film is patterned using the resist as a mask; and the resist is removed separately from the oxidized residue.

* * * * *

UNITED STATES PATENT AND TRADEMARK OFFICE
CERTIFICATE OF CORRECTION

PATENT NO. : 6,279,585 B1
DATED : August 28, 2001
INVENTOR(S) : Shiraki et al.

It is certified that error appears in the above-identified patent and that said Letters Patent is hereby corrected as shown below:

Title page,
Please change "[75] Inventors: Satoshi Shiraki, Toyoashi; Makoto
Ohkawa, Kariva, both of (JP)"
to
-- [75] Inventors: Satoshi Shiraki, Toyohashi; Makoto
Ohkawa, Kariya, both ofs (JP) --

Signed and Sealed this

Twenty-sixth Day of February, 2002

Attest:

Attesting Officer

JAMES E. ROGAN
Director of the United States Patent and Trademark Office